(12) United States Patent
Kumar et al.

(10) Patent No.: US 12,506,479 B2
(45) Date of Patent: Dec. 23, 2025

(54) HIGH-VOLTAGE FAULT PROTECTION CIRCUIT

(71) Applicant: STMicroelectronics International N.V., Geneva (CH)

(72) Inventors: Manoj Kumar, Greater Noida (IN); Paras Garg, Noida (IN); Saiyid Mohammad Irshad Rizvi, New Delhi (IN)

(73) Assignee: STMicroelectronics International N.V., Geneva (CH)

( * ) Notice: Subject to any disclaimer, the term of this patent is extended or adjusted under 35 U.S.C. 154(b) by 235 days.

(21) Appl. No.: 18/356,146

(22) Filed: Jul. 20, 2023

(65) Prior Publication Data

US 2024/0039537 A1    Feb. 1, 2024

Related U.S. Application Data

(60) Provisional application No. 63/369,493, filed on Jul. 26, 2022.

(51) Int. Cl.
  *H03K 19/003* (2006.01)
  *H03K 19/0185* (2006.01)

(52) U.S. Cl.
  CPC ............... *H03K 19/00315* (2013.01); *H03K 19/018521* (2013.01)

(58) Field of Classification Search
  CPC ......... H03K 19/018521; H03K 3/037; H03K 3/356182; H03K 19/00315; H03K 17/687; H03K 17/04106; H03K 17/08142; H03K 17/102; H03K 17/302; H03K 19/018507; H03K 2217/0018; H03K 2217/0054; G11C 7/1057; G11C 11/4074; G11C 11/4093; G11C 11/4094; G06F 1/3296; G06F 13/102; G06F 30/392

See application file for complete search history.

(56) References Cited

U.S. PATENT DOCUMENTS

| | | |
|---|---|---|
| 7,164,305 B2 | 1/2007 | Gupta et al. |
| 8,344,760 B2 | 1/2013 | Du et al. |
| 8,994,412 B2 | 3/2015 | Kim |
| 2017/0264290 A1* | 9/2017 | Fukuda ............. H03K 17/0822 |
| 2022/0231686 A1* | 7/2022 | Lee ................ H03K 19/018521 |

* cited by examiner

*Primary Examiner* — Lincoln D Donovan
*Assistant Examiner* — Tyler J Pereny
(74) *Attorney, Agent, or Firm* — Seed Intellectual Property Law Group LLP

(57) ABSTRACT

The present disclosure is directed to a high-voltage fault protection for an interface circuit. The interface circuit is transmitting data signals through an output driver to an external circuit coupled to a PAD contact. The output driver includes pull-up and pull-down drivers. The pull-up driver includes two series PMOS coupled between a voltage supply and the PAD. The pull-down driver includes two series NMOS coupled between the PAD and a ground node. A first safe signal is coupled to one PMOS. A first circuit scheme is designed to generate the first safe signal to be low-logical level voltage when the PAD voltage is lower than a threshold, while being high-logical level voltage when the PAD voltage is higher than the threshold. A second circuit scheme is designed to control one of the series NMOS to be in OFF state when the PAD voltage is higher than the threshold.

18 Claims, 8 Drawing Sheets

| Nodes | 1. Normal Mode<br>Supply Available<br>Enable=1 ; Driver ON<br><br>No Static Current Consumption | 2. Tolerant Condition<br>Supply Available<br>Enable=0 ; Driver OFF<br>PAD = 5.5V (> ~4.5V) | 3. Failsafe Condition<br>Supply=0<br>Enable=0<br>PAD = 5.5V (> ~4.5V) | 4. Tolerant ON Condition<br>Supply Available<br>Enable=1 ; Driver ON<br>PAD = 5.5V (> ~4.5V) |
|---|---|---|---|---|
| PD | 0 / VDD3V3 | VDD3V3 | NSAFE | 0 / VDD3V3 |
| PSAFE | 0 | PAD | PAD | PAD |
| NSAFE | VDD3V3 | VDD3V3 | ~3V generated from PAD | VDD3V3 |
| ND | 0 / VDD3V3 | 0 | 0 | 0 |
| FW | Max of VDD3V3 and PAD | | | |

*FIG.5*

HIGH-VOLTAGE FAULT PROTECTION CIRCUIT

BACKGROUND

Technical Field

The present disclosure is directed to a protection circuit to detect a high-voltage fault condition and protect a transmit circuit by generating a safe signal. In particular, the protection circuit includes a plurality of transistors to generate the safe signal based on an output voltage.

Description of the Related Art

Scaling down integrated circuits (ICs) is desired for low cost and low power applications. Accordingly, reducing dimensions of devices within an IC is a typical way for scaling down the IC. Generally smaller devices are designed to work with lower voltage. However, some ICs working as interface circuits such as input/output buffers are coupled to external circuit components that may work in a different voltage level. For instance, the interface circuit may work in a 3.3V technology while the external circuit is working with a 5V technology. Applying 5V voltage to electrical devices such as complimentary metal-oxide semiconductor (CMOS) transistors that work in a 3.3V technology, for example, may damage the device by causing gate-oxide stress. The gate-oxide stress can affect device performance by fluctuating threshold voltage of the transistor due to tunneling effect that consequently reduces the device lifetime.

In a similar fashion, when the circuit is in a drive mode and is coupled to an output stage with high-voltage level (e.g., 5V), a huge current flow from the output stage to the buffer circuit can affect the circuit performance and damage components. For instance, a voltage supply of the interface circuit may supply 3.3V to the components of the interface circuit while the output stage voltage is higher than 5V. Thus, a huge current flow from the output stage to the voltage supply can cause electromigration of the circuit. The electromigration can damage the circuit with directional diffusion of circuit conductors. In addition, a huge current flow from the output stage into a ground of the circuit can cause ground bounce which affects switching performance of the circuit and causes unstable operation. Hence, a protection scheme that prevents excessive stress on the circuit devices as well as huge current flow from the output stage, can increase reliability of the interface circuits.

BRIEF SUMMARY

The present disclosure is directed to a high-voltage fault protection for an interface circuit (also known as high-voltage tolerant buffer circuit). In general, interface circuits such as input/output buffers transmit and receive data signals to an external circuit. In a driving mode, while the interface circuit is transmitting or receiving data, a voltage difference between the external circuit and the interface circuit may affect the circuit performance and damage circuit components. In various embodiments of the present disclosure, an interface circuit is transmitting data signals through an output driver to an external circuit coupled to a PAD contact. The output driver includes pull-up driver and pull-down driver. The pull-up driver includes at least one PMOS coupled between a voltage supply and the PAD. The pull-down driver includes at least one NMOS coupled between the PAD and a ground node (hereinafter PMOS/NMOS refer to P-type/N-type metal-oxide-semiconductor field-effect transistor (MOSFET)). In this fashion, if a voltage level of the PAD is greater than the voltage supply, a current flow from the PAD into the voltage supply and the ground can disturb the interface circuit performance. In addition, the PMOS and NMOS may be damaged due to an excessive voltage stress from a high-voltage external circuit.

In some embodiments, a second PMOS is coupled in series to the driver PMOS in pull-up driver to protect the PMOS from the excessive voltage stress. In a similar fashion, a second NMOS is coupled in series to the driver NMOS in pull-down driver to protect the NMOS from the excessive voltage stress. In operation mode, a first safe signal controls the second PMOS (PSAFE signal) and a second safe signal controls the second NMOS (NSAFE signal). The first and second safe signals can be designed to apply different voltage levels to the second PMOS and the second NMOS based on the operation mode and a voltage of the PAD. For instance, a first circuit scheme is designed to generate the first safe signal to be low-logical level voltage when the PAD voltage is lower than a threshold, while connecting the PAD to the first safe signal when the PAD voltage is higher than the threshold. The first circuit scheme includes a plurality of PMOS and NMOS transistors. In addition, a second circuit scheme is designed to control the driver NMOS to be in OFF state when the PAD voltage is higher than the threshold. The second circuit scheme includes two series logical 'AND' gates. These circuit schemes provide a capability to protect the interface circuit against high-voltage fault, without interrupting the driver circuit when it is in a driving mode.

BRIEF DESCRIPTION OF THE SEVERAL VIEWS OF THE DRAWINGS

Aspects of the present disclosure are best understood from the following detailed description when read with the accompanying figures. It is noted that various features are not drawn to scale.

FIG. 5 is a table representing different operation modes of the circuit of FIG. 2, in accordance with some embodiments.

DETAILED DESCRIPTION

Figure 1:
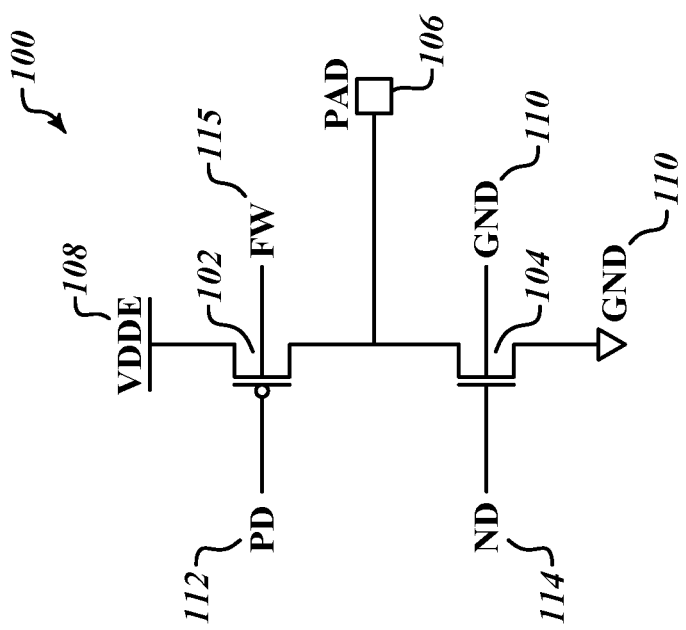
FIG. 1 is a topology of a transmit circuit, in accordance with some embodiments.

FIG. 1 is a conventional topology of a transmit circuit 100. The transmit circuit 100 includes two MOSFETs coupled to an output contact (PAD). Each of the two MOSFETs can drive the output contact with a control signal. The MOSFETs are coupled to an input/output (I/O) domain voltage supply (VDDE). In this fashion, an operation voltage of the VDDE can be compatible with an operation technology of the MOSFETs (e.g., 1.8V, 3.3V, 5V, etc). The output contact may be coupled to a high-voltage stage with a voltage higher than the operation technology of the MOSFETs.

The circuit 100 includes a first transistor 102 coupled to a voltage supply 108 and an output contact (PAD) 106, and a second transistor 104 coupled to the output contact (PAD) 106 and a reference node 110. In various embodiments, the reference node 110 is coupled to an electrical ground. In various embodiments, the first and second transistors 102, 104 are MOSFETs. In this fashion, the first transistor 102 is PMOS and the second transistor 104 is NMOS. A first control signal PD 112 is applied to a gate terminal of the PMOS 102. A second control signal ND 114 is applied to a gate terminal of the NMOS 104. A body floating terminal of the transistor 104 is coupled to the ground 110, while a body floating terminal of the transistor 102 is coupled to a voltage FW 115. The voltage FW 115 can be a maximum voltage between the voltage supply 108 and the PAD 106.

In some embodiments, the voltage supply 108 is an I/O domain voltage supply (VDDE). A voltage of the voltage supply 108 may be corresponding to the operation technology of the PMOS 102 and the NMOS 104. In some examples, the voltage of the voltage supply 108 and the operation technology of the PMOS 102 and the NMOS 104 are 3.3V. In some examples, the PAD 106 may be coupled to a high-voltage stage. The high-voltage stage may apply a voltage higher than 3.3V to the output contact 106. The control signals PD 112 may transmit a data signal (P-data) to the PAD 106 by switching "ON" and "OFF" the PMOS 102. In a similar fashion, the control signals ND 114 may transmit a data signal (N-data) to the PAD 106 by switching "ON" and "OFF" the NMOS 104. In a condition that PAD 106 is coupled to a high-voltage stage (e.g., 5V) and the PMOS 102 is ON, an electrical potential difference between the PAD 106 (e.g, 5V) and the VDDE 108 (3.3V) results in a huge electrical current flow from the PAD 106 to the voltage supply 108. In a same fashion, when PAD 106 is coupled to a 5V stage and the NMOS 104 is ON, an electrical potential difference between the PAD 106 (e.g., 5V) and the ground 110 (0V) results in a huge electrical current flow from the PAD 106 to the ground 110. The huge current flows, which can be in a range of 100 mA or higher, may damage the circuit elements and/or destroy performances of the circuit 100. For instance, the huge current flow may cause an electromigration phenomena and damage the circuit elements due to a directional diffusion of circuit conductors. In addition, coupling the high-voltage stage to the ground 110 may cause ground bounce that affects a logical circuit operation (e.g., switching performance). Further, in a condition that the PAD 106 is coupled to the high-voltage stage and each of the PMOS 102 and/or NMOS 104 are in OFF state, a high electrical potential difference between the PAD 106 and the PMOS 102 and/or NMOS 104 applies a stress on the drain-source and/or drain-gate junctions of the devices that consequently may damage the devices.

Figure 2:
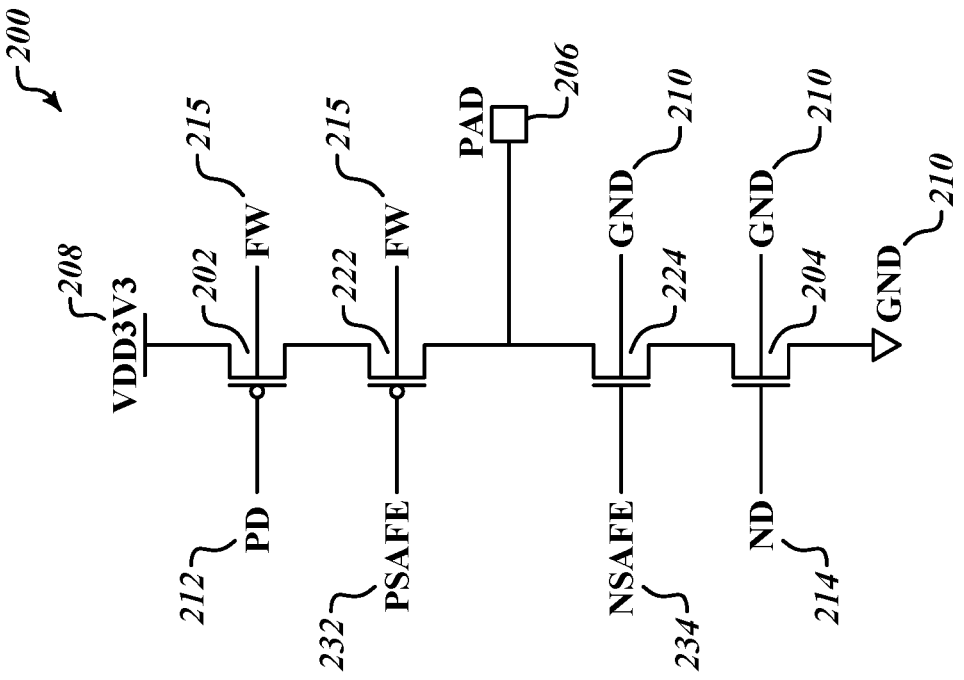
FIG. 2 is a protected topology of the transmit circuit in FIG. 1, in accordance with some embodiments.

FIG. 2 is a protected scheme of the circuit described in FIG. 1. A cascoded circuit topology can provide a protection against a high-voltage PAD coupled to the transmit circuit 100 of FIG. 1 working in a lower electrical potential level. In this fashion, two cascoded PMOS are coupled between the VDDE and PAD, and two cascoded NMOS are coupled between the PAD and a ground.

In some embodiments, a circuit 200 includes a first transistor 202 coupled to a voltage supply 208 and a control signal PD 212. A second transistor 222 is coupled between the first transistor 202 and an output contact (PAD) 206. The transistor 222 is controlled with a first safe signal 232. In this fashion, the transistor 202, the voltage supply 208, and control signal PD 212 can be corresponding to the transistor 102, the voltage supply 108, and control signal PD 112 described in FIG. 1. The output contact PAD 206 may be coupled to a high-voltage stage similar to a condition described in FIG. 1. The transistors 202 and 222 are PMOS that are coupled together in series. In a conventional scheme, the first safe signal 232 is designed to protect the PMOS 202 from a voltage stress due to an electrical potential difference between the PAD 206 and the PMOS 202. In this fashion, when the PMOS 202 is in OFF state and the PAD 206 is coupled to a high-voltage stage, the first safe signal 232 compensates the electrical potential difference between the PAD 206 and the PMOS 202. Thus, the stress on the PMOS 202 is reduced when working in OFF state. However, when the PMOS 202 is in ON state and PAD 206 is coupled to the high-voltage stage, still a large, potentially damaging current flow may happen between the PAD 206 and the voltage supply 208.

The circuit 200 further includes a third transistor 224 coupled to a second safe signal 234 and the PAD 206. A fourth transistor 204 is coupled between the third transistor 224 and a ground 210. The transistor 204 is controlled with a control signal ND 214. In this fashion, the transistor 204, the ground 210, and control signal ND 214 can be corresponding to the transistor 104, the ground 110, and control signal 114 described in FIG. 1. The transistors 204 and 224 are NMOS that are coupled together in series. Body floating terminals of the transistors 204 and 224 are coupled to the ground 210, while body floating terminals of the transistors 202 and 222 are coupled to a voltage FW (an intermediate voltage) 215. The voltage FW 215 may be a maximum voltage between the voltage supply 208 and the PAD 206.

In a conventional scheme, the second safe signal 234 is designed to protect the NMOS 204 from a voltage stress due to an electrical potential difference between the PAD 206 and the NMOS 204. In this fashion, when the NMOS 204 is in OFF state and the PAD 206 is coupled to a high-voltage stage, the second safe signal 234 compensates the electrical potential difference between the PAD 206 and the NMOS 204. Thus, the stress on the NMOS 204 is reduced when working in OFF state. However, when the NMOS 204 is in ON state and PAD 206 is coupled to the high-voltage stage, a large current flow may still happen between the PAD 206 and the ground 210.

Although the cascoded transistors in FIG. 2 can protect the transmit circuit against the OFF state device stress, the current flow during the ON state operation may still damage the devices and cause nonstable operation of the circuit. In various embodiments of the present disclosure, a circuit topology to generate safe signals and control signals provides high-voltage protection of the circuit 200 in both OFF and ON state operations.

Figure 3A:
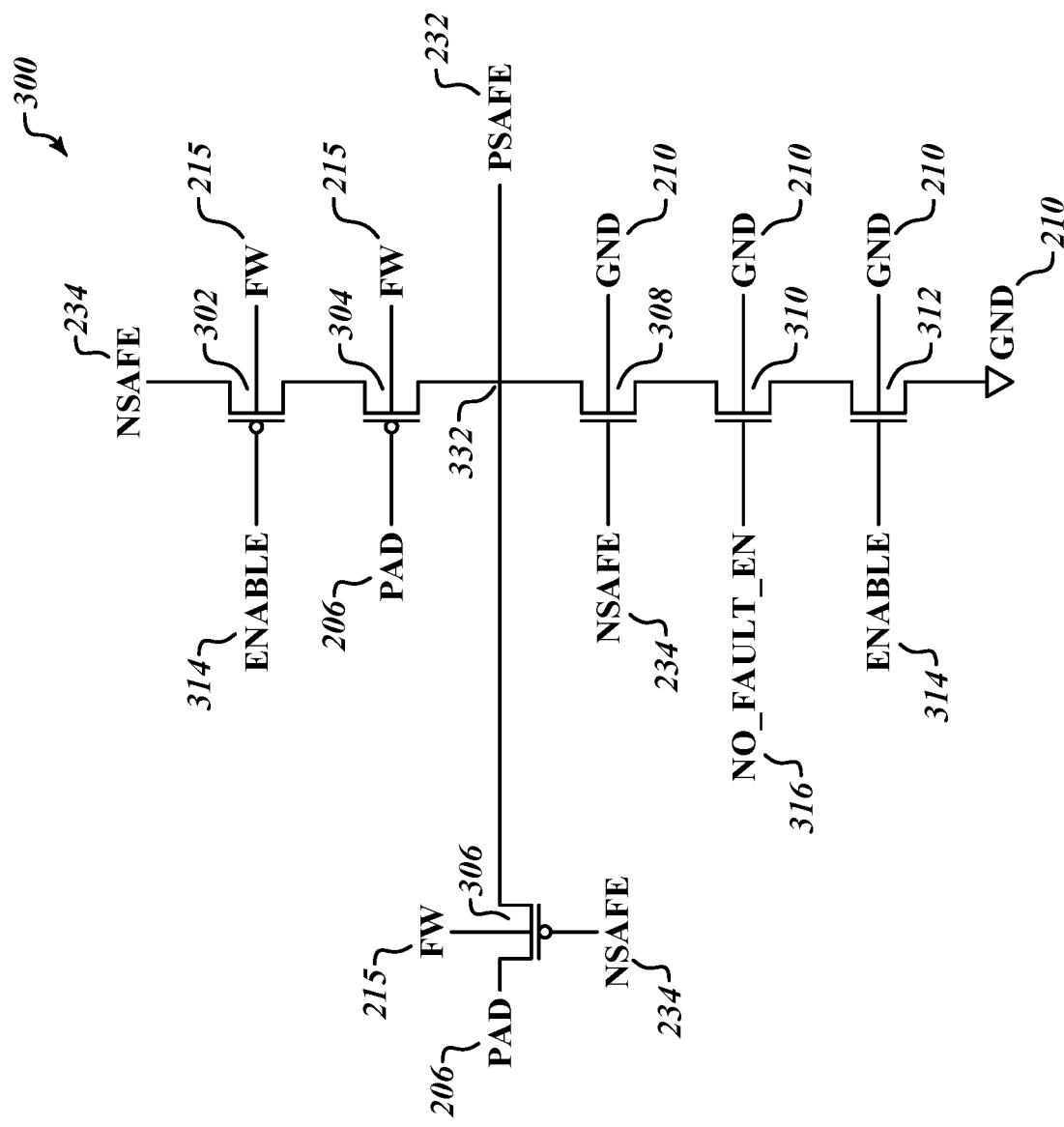
FIG. 3A is a circuit topology to generate a first safe signal of FIG. 2, in accordance with some embodiments.

FIG. 3A is a circuit topology 300 to generate the first safe signal 232 described in FIG. 2. The circuit 300 includes cascoded PMOS and NMOS transistors controlled with the safe signal 234 and the PAD 206 described in FIG. 2. The circuit 300 further includes a PMOS coupled to the PAD as well as two enabling signals coupled to the transistors.

In various embodiments, the circuit 300 includes a first transistor 302 coupled to the safe signal 234 and an enable signal 314. A second transistor 304 is coupled between the first transistor 302 and a node 332. The second transistor 304 is controlled by the PAD 206. The node 332 is coupled to the safe voltage 232 of FIG. 2. A third transistor 306 is coupled between the node 332 and PAD 206. The third transistor 306 is controlled by the safe signal 234. In this fashion, the transistors 302, 304, and 306 are PMOS. The transistors 302 and 304 are coupled together in series.

A fourth transistor 308 is coupled to the node 332 and the safe signal 234. A fifth transistor 310 is coupled to the transistor 308 and a no fault enable signal 316. A sixth transistor 312 is coupled to the transistor 310 and the ground 210. The transistor 312 is controlled with the enable signal 314. In this fashion, the transistors 308, 310, and 312 are NMOS that are coupled together in series. The safe signal generation circuit 300 detects a fault voltage condition, where the PAD 206 voltage is higher than the voltage of the voltage supply 208 and generates the safe signal 232 based on the fault voltage detection. Body floating terminals of the transistors 308, 310, and 312 are coupled to the ground 210, while body floating terminals of the transistors 302, 304, and 306 are coupled to the voltage FW 215. The voltage FW 215 is same as the FW 215 described in FIG. 2.

In various embodiments, the circuit 200 is a part of a transmit circuit which transmits a logical set of data by the control signals PD 212 and ND 214 to the PAD 206. The PAD 206 is coupled to a different stage that may have a different voltage than the circuit 200. In some embodiments, the circuit 200 operates in a 3.3V technology. In this fashion, the voltage supply 208 and operation technology of all the transistors of the circuit 200 are 3.3V. When the stage coupled to the PAD 206 has a lower voltage than the circuit 200 (e.g., 3.3V) the transmit circuit 200 is working in a normal mode. If the voltage of the stage coupled to the PAD 206 becomes higher than the operation technology of the circuit 200 (e.g., 5V), the transmit circuit 200 works in a fault voltage condition. In the fault voltage condition, a current flow from the PAD 206, with higher voltage, to the transistors of the circuit 200, voltage supply 208, and ground 210 of the transmit circuit 200, with lower voltage, may damage the circuit elements and cause malfunction of the transmit circuit 200.

In an operation mode of the transmit circuit 200, the circuit 300 detects the normal mode or fault voltage condition and changes the safe signal 232 based on the operation mode. In this fashion, if the circuit 200 is working in a normal mode, the PAD 206 voltage is lower than the voltage supply 208. In the case that safe signal 234 is coupled to the voltage supply 208, the PAD 206 voltage is lower than the safe voltage 234 and the PMOS 306 is OFF. In this condition, if the enable signal 314 and no fault enable signal 316 are in high logical level, the PMOS transistors 302 and 304 are OFF while NMOS transistors 308, 310, and 312 are ON and the node 332 is coupled to the ground 210. Hence, in a normal mode with enable-high signals, the safe signal 232 is coupled to the ground having a low logical level voltage. Accordingly, in the normal condition when the transistor 202 in FIG. 2 is enabled to transmit data through the control signal PD 212 to the PAD 206, the safe signal 232 is in low logical level and the PMOS 222 is ON.

In another aspect of the normal mode, if the enable signal 314 is in low logical level, the NMOS transistor 312 is OFF while PMOS transistors 302 and 314 are ON and the node 332 is coupled to the safe voltage 234 that is coupled to the voltage supply 208 (VDDE). Hence, in a normal mode with enable-low signal, the safe signal 232 is coupled to the VDDE voltage 208. Accordingly, in the normal condition when the transistor 202 in FIG. 2 is disabled, the safe signal 232 is in high logical level and greater than the PAD 206 voltage (normal mode), then the PMOS 222 is OFF.

If the circuit 200 is working in the fault voltage condition, the PAD 206 voltage is higher than the voltage supply 208. In the case that safe signal 234 is coupled to the voltage supply 208, if the PAD 206 voltage is greater than a summation of the safe voltage 234 and a voltage threshold ($V_T$) of the PMOS 306 (PAD>NSAFE+$V_T$), then the PMOS 306 is ON. In this condition, the node 332 is coupled to the PAD 206 voltage. Regardless of the enable signal 314 condition, the PMOS 304 is OFF. In the fault voltage condition, the no fault enable signal 316 should be set to a low logical level to disconnect the node 332 from the ground 210 by turning OFF the NMOS 310. Hence, a circuit topology is designed to generate the no fault enable signal 316 based on the operation mode of the circuit 200, as shown in a circuit topology 350 of FIG. 3B. In the fault voltage condition, the safe signal 232 is coupled to the PAD 206 having a high logical level voltage. Thus, the PMOS 222 in FIG. 2 is OFF to avoid any huge current flow from the PAD 206 to the VDDE 208. In addition, the safe voltage 232 is the same as PAD 206 voltage that prevents any excessive voltage stress on the circuit 200 due to the high-voltage stage coupled to the PAD 206. The safe signal generation circuit 300 detects both the normal mode and fault voltage condition to change the safe signal 232 when the transmit circuit 200 is either enabled or disabled to transmit data.

Figure 3B:
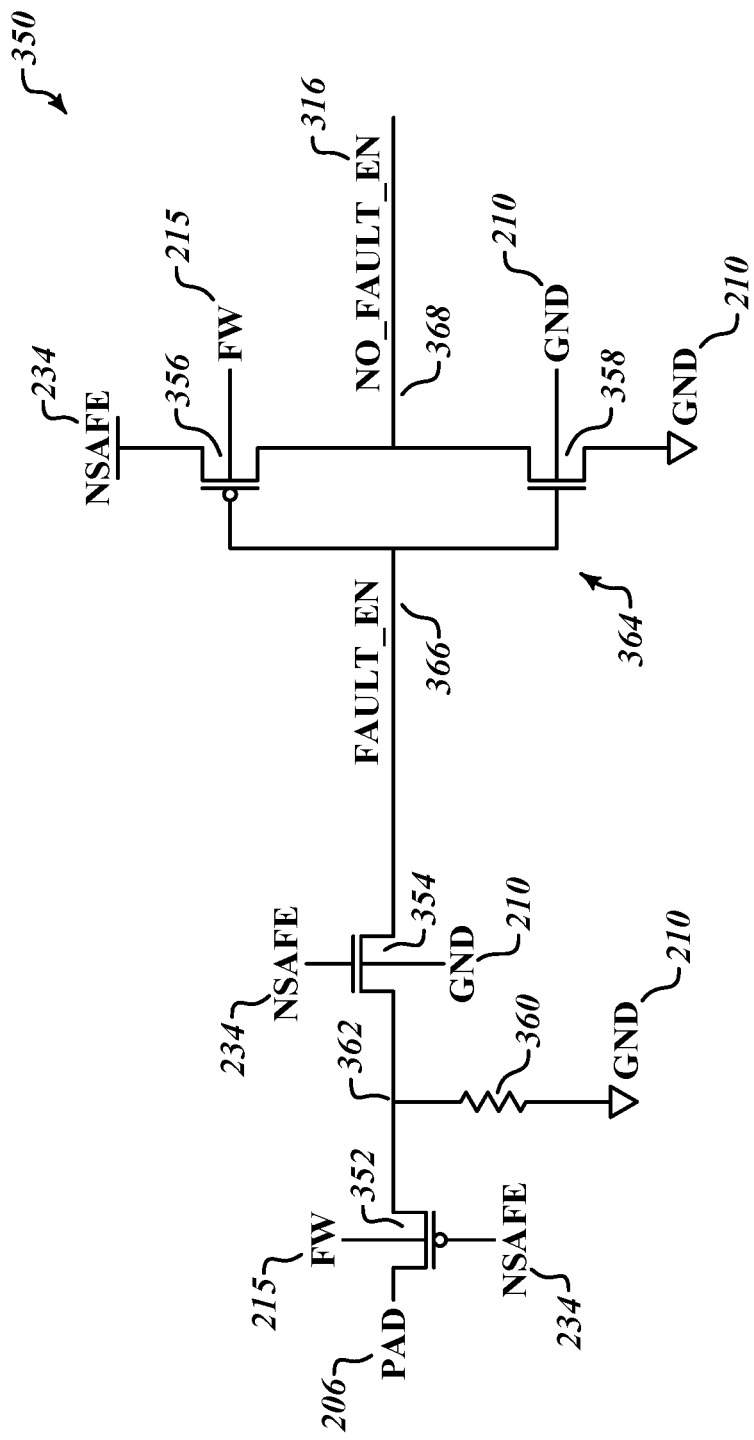
FIG. 3B is a circuit topology to generate a no fault enable signal of FIG. 3A, in accordance with some embodiments.

FIG. 3B is the circuit topology 350 to generate the no fault enable signal 316 described in FIG. 3A. The circuit 350 includes PMOS and NMOS transistors coupled to the safe signal 234 and the PAD 206 described in FIG. 2. The circuit 350 further includes an inverter circuit comprising NMOS and PMOS transistors. A logical level of an output signal of the inverter circuit is opposite to a logical level of an input signal to the inverter circuit.

In various embodiments, the circuit 350 includes a first transistor 352 coupled to the PAD 206 and a node 362. The first transistor 352 is controlled by the safe signal 234. A second transistor 354 is coupled between the node 362 and a node 366. A resistor 360 is coupled between the node 362 and the ground 210. The node 366 is a fault enable signal (FAULT_EN) coupled to a logical inverter 364. The logical inverter 364 includes a third transistor 356 coupled between the safe signal 234 and a node 368. The node 368 is coupled to no fault enable (NO_FAULT_EN) signal 316 of FIG. 3A. A fourth transistor 358 is coupled between the node 368 and the ground 210. The transistors 356 and 358 are controlled with the fault enable signal 366. In this fashion, the transistors 352 and 356 are PMOS, and transistors 354 and 358 are NMOS. Body floating terminals of the transistors 354 and 358 are coupled to the ground 210, while body floating terminals of the transistors 352 and 356 are coupled to the voltage FW 215. The voltage FW 215 is same as the FW 215 voltage described in FIG. 2.

As described in FIG. 3A, the no fault signal 316 should be in low logical level when the circuit 200 is in fault voltage condition. Assuming the safe voltage 234 is connected to VDDE 208, in the fault voltage condition the voltage PAD 206 is greater than the summation of the safe voltage 234 and the voltage threshold ($V_T$) of the PMOS 306 (PAD>NSAFE+$V_T$). In this condition, the PMOS 352 is ON and a voltage of the node 362 is equal to PAD 206. Thus, the NMOS 354 is OFF and the voltage fault enable at node 366 is in a high logical level. The inverter 364 inverts the fault enable signal at node 366 to the no fault enable signal 316 at node 368. Hence, when the circuit 200 is in a fault voltage condition the no fault enable signal 316 is in a low logical level.

In a normal mode, when the PAD 206 voltage is less than the safe signal 234, the PMOS 352 is OFF. In this fashion, if a voltage of the node 362 is less than the summation of the safe voltage 234 and the voltage threshold ($V_T$) of the NMOS 354 (node 362>NSAFE+$V_T$), then the NMOS 354 is ON and the fault enable signal 366 is in a low logical level. Thus, the no fault signal 316, that is opposite to the node 366, is in a high logical level. Accordingly, the circuit 350 generates the no fault enable signal as a high logical level in the fault voltage condition and as a low logical level in a normal mode operation.

In various embodiments, to prevent a huge current flow from the PAD 206 to the ground 210 when the circuit 200 is in the fault voltage condition, the NMOS 204 is turned OFF when the fault voltage condition is detected. The NMOS 204 is controlled by the control signal ND 214. A circuit 400 in FIG. 4 is designed to generate the desired control signal ND 214 based on the operation mode of the circuit 200.

Figure 4:
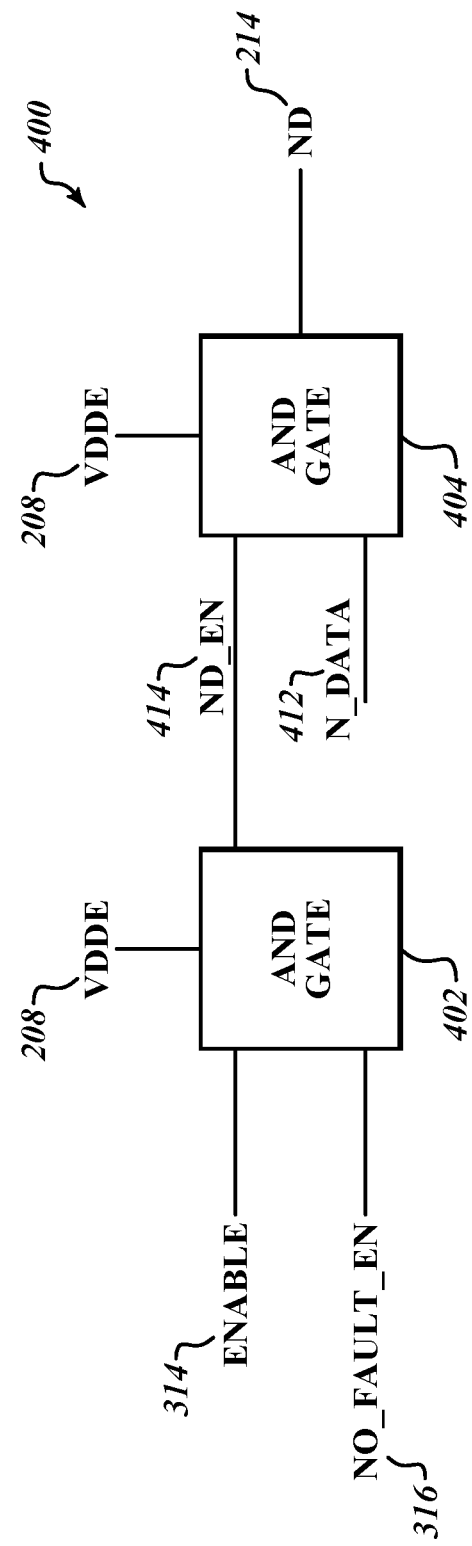
FIG. 4 is a circuit topology to generate a control signal of FIG. 2, in accordance with some embodiments.

FIG. 4 is a circuit topology 400 to generate the control signal ND 214 described in FIG. 2. The circuit 400 includes two logical gates coupled together in series. The logical gates are coupled to the voltage supply 208. The voltage supply 208 has a same voltage VDDE as described in FIG. 2. When the circuit 200 in FIG. 2 is in a fault voltage condition, the control signal ND 214 should be in a low logical level to turn OFF the NMOS 204 and disconnect the PAD 206 from the ground 210.

In some embodiments, the circuit 400 includes a first logical gate 402 and a second logical gate 404. The first logical gate 402 includes a first input coupled to the enable signal 314, a second input coupled to the no fault enable signal 316, and an output coupled to an ND enable signal 414 (ND_EN). The second logical gate 404 includes a first input coupled to the ND enable signal 414, a second input coupled to a data signal 412 (N_DATA), and an output coupled to the control signal ND 214. The first logical gate 402 and the second logical gate 404 are AND gates. Generally, an output of an AND gate is in a high logical level when both the inputs of the gate are in a high logical level at a same time.

In a normal mode operation, the enable signal 314 and the no fault enable signal 316 are in a high logical level. Thus, the ND enable signal 414 is in a high logical level. Thus, the control signal ND 214 follows logical level of the data signal 412. If the circuit is in a fault voltage condition, the no fault enable signal 316 is in a low logical level. Hence, the output of the first gate 402 is in a low logical level. When the ND enable signal 414 is in a low logical level the output of the second logical gate 404 is in a low logical level, regardless to the logical level of the data signal 412. Hence, this circuit keeps the ND signal 214 in a low logical level during the fault voltage condition. Consequently, the NMOS 204 of circuit 200 in FIG. 2 is OFF during the fault voltage condition.

FIG. 5 is a table describing voltage level of the nodes in circuit 200 of the FIG. 2 in various operation modes. The circuit operation can be divided to four main modes as the columns indicated in the table of FIG. 5. Each row of the table represents a voltage value of input nods of the circuit 200 in FIG. 2. In various embodiments, the input nodes are gate terminals of the transistors 202, 204, 222, and 224 of the circuit 200 in FIG. 2. First row is the voltage PD 212, the second row is the safe signal 232, the third row is the safe signal 234, and the fourth row is the voltage ND 214. As described above, the voltage FW 215 can be a maximum voltage between the voltage supply 208 and the PAD 206. For instance, a comparator circuit may compare the PAD 212 voltage with the voltage supply 208. In conditions that PAD 212 voltage is greater than the voltage supply 208 then the comparator circuit connects the PAD 212 voltage to the FW 215. Otherwise, the comparator circuit connects the voltage supply 208 to the FW 215.

In a normal mode a voltage of the PAD 206 is not greater than a voltage of the voltage supply 208 (VDDE=3.3V). In the normal mode, the safe signal 232 is in a low logical level (PMOS 222 is ON) and the safe signal 234 is in a high logical level with a voltage equal to VDDE 208 (NMOS 224 is ON). In this fashion, the enable signal 314 is in a high logical level (Driver ON) and data signals may be transmitted through the control signals PD 212 and ND 214 to the PAD 206. As the PAD 206 voltage is not greater than the VDDE 208, there is no huge current flow or device stress in a normal mode.

A second mode is a tolerant condition, where the voltage of the PAD 206 is greater than a voltage of the voltage supply 208 (VDDE=3.3V). In the tolerant mode, the safe signal 232 is in a high logical level with a voltage equal to PAD 206 (PMOS 222 is OFF) and the safe signal 234 is in a high logical level with a voltage equal to VDDE 208 (NMOS 224 is ON). In this fashion, the enable signal 314 is in a low logical level (Driver OFF) and no data signal is transmitting to the PAD 206. Thus, PD 212 is in a high logical level with a voltage equal to VDDE 208 (PMOS 202 is OFF) and ND 214 is in a low logical level (NMOS 204 is OFF). As the transistors 222 and 204 are OFF in tolerant condition, there is no huge current flow from the PAD 206 to the voltage supply 208 and the ground 210. In addition, a gate voltage of PMOS 222 is the same as the PAD 206 voltage applied to a drain terminal of PMOS 222, which consequently protects the devices 222 and 202 from any excessive voltage stress (gate-drain voltage is low). In a same fashion, a gate voltage of NMOS 224 is equal to VDDE 208 that is close to the PAD 206 voltage applied to a drain terminal of NMOS 224, which consequently protects the devices 224 and 204 from any excessive voltage stress (gate-drain voltage is low).

A third mode is a failsafe condition, where the voltage of the PAD 206 is greater than a threshold voltage (e.g., 4.5V) and the voltage supply 208 is OFF. In the failsafe mode, the safe signal 232 is in a high logical level with a voltage equal to PAD 206 (PMOS 222 is OFF) and the safe signal 234 is in a high logical level with a voltage about 3V (NMOS 224 is ON). In this fashion, the enable signal 314 is in a low logical level (Driver OFF) and no data signal is transmitting to the PAD 206. Thus, PD 212 is in a high logical level with a voltage equal to the safe signal 234 (PMOS 202 is OFF) and ND 214 is in a low logical level (NMOS 204 is OFF). As the transistors 222 and 204 are OFF in failsafe condition, there is no huge current flow from the PAD 206 to the voltage supply 208 and the ground 210. In addition, a gate voltage of PMOS 222 is the same as the PAD 206 voltage applied to a drain terminal of PMOS 222, and consequently protects the devices 222 and 202 from any excessive voltage stress (gate-drain voltage is low). In a same fashion, a gate voltage of NMOS 224 is 3V that is close to the PAD 206 voltage applied to a drain terminal of NMOS 224, which consequently protects the devices 224 and 204 from any excessive voltage stress (gate-drain voltage is low).

A fourth mode is a tolerant ON condition, where the voltage of the PAD 206 is greater than a voltage of the voltage supply 208 (VDDE=3.3V) while the enable signal 314 is in a high logical level (Driver ON). In the tolerant ON mode, the safe signal 232 is in a high logical level with a voltage equal to PAD 206 (PMOS 222 is OFF) and the safe signal 234 is in a high logical level with a voltage equal to VDDE 208 (NMOS 224 is ON). In this fashion, the enable signal 314 is in a high logical level (Driver ON) to transmit data signals through the control signals PD 212 and ND 214 to the PAD 206. However, the circuits of embodiments in FIGS. 3A-4 detect a fault voltage condition and prevents a data signal transmission to the PAD 206, where NMOS 204 of the circuit 200 in FIG. 2 is OFF by keeping ND 214 in a low logical level using the circuit 400 in FIG. 4. In addition, data transmission from the control signal PD 212 is disconnected from the PAD 206 by keeping the PMOS 222 in OFF state during the fault voltage condition. Hence, as the transistors 222 and 204 are OFF in the tolerant ON condition, there is no huge current flow from the PAD 206 to the voltage supply 208 and the ground 210. In addition, a gate voltage of PMOS 222 is the same as the PAD 206 voltage applied to a drain terminal of PMOS 222, which consequently protects the devices 222 and 202 from any excessive voltage stress (gate-drain voltage is low). In a same fashion, a gate voltage of NMOS 224 is VDDE that is close to the PAD voltage applied to a drain terminal of NMOS 224, and consequently protects the devices 224 and 204 from any excessive voltage stress (gate-drain voltage is low). Although the protection method described in FIGS. 2-5 illustrate a circuit working in 3.3V technology by a 5V tolerant, the same technique may be used for different technologies and tolerant, e.g., for a circuit working in 1.8V technology by a 3.3V tolerant.

Figure 6A:
FIG. 6A is a circuit topology to generate a second safe signal of FIG. 2, in accordance with some embodiments.

FIG. 6A is a circuit topology 600 to generate a second safe signal 234 of FIG. 2. Circuit 600 includes a plurality of PMOS and NMOS transistors that form a voltage divider circuit. As described in FIG. 5, the safe signal 234 is equal to the voltage supply VDDE 208. When the voltage supply 208 is not available, the safe signal 234 has a voltage around 3V. This 3V voltage is generated from the PAD 206 voltage with the circuit 600.

In some embodiments, the circuit 600 includes a first transistor 602 coupled to the PAD 206. A second transistor 604 is coupled to the first transistor 602. A third transistor 606 is coupled between the second transistor 604 and a node 634. The third transistor 606 is controlled by the voltage supply 208. The node 634 is coupled to the safe signal 234 (NSAFE). A fourth transistor 608 is coupled to the voltage supply 208 and the node 634. The fourth transistor 608 is controlled by an IO off signal 610. A fifth transistor 612 is coupled to the node 634 and the voltage supply 208. A sixth transistor 614 is coupled to the fifth transistor 612, a seventh transistor 616 is coupled to the sixth transistor 614, an eighth transistor 618 is coupled to the seventh transistor 616, and a ninth transistor 620 is coupled to the eighth transistor 618 and the ground 210. The ninth transistor 620 is controlled by the IO off signal 610.

In various embodiments, the first transistor 602, the second transistor 604, the seventh transistor 614, the eighth transistor 616, and the ninth transistor 618 are in self-biased configuration. The first transistor 602, the second transistor 604, the sixth transistor 614, the seventh transistor 616, the eighth transistor 618, and the ninth transistor 620 are NMOS. The third transistor 606, the fourth transistor 608, and the fifth transistor 612 are PMOS. The first 602, second 604, and third 606 transistors are in series. The fifth 612, sixth 614, seventh 616, eighth 618 and ninth 620 transistors are in series.

When the voltage supply 208 is available with the voltage VDDE, gate terminals of the third transistor 606 and the fifth transistor 612 are in high logical level. Thus, the PMOS 606 and PMOS 612 are OFF to disconnect the self-biased transistors from the safe signal 234. In this fashion, the signal 610 is in a low logical level and the PMOS 610 is ON, and the voltage supply 208 is appeared in node 634 for the safe signal 234. When the voltage supply 208 is not available the voltage VDDE is in a low logical level. In this fashion, the IO off signal 610 is in high logical level. Thus, PMOS 610 is OFF and PMOS 606 and PMOS 612 are ON. The self-biased transistors including the first 602, second 604, and third 606 transistors divide the PAD voltage 206 as a voltage divider. In a case that the voltage PAD is around 5.5V, then a voltage around 3V is dropped on the node 634 as the safe signal 234. As the IO off signal 610 is in high logical level, the NMOS 620 is ON and all the transistors 602, 604, 606, 612, 614, 616, 618, and 620 are coupled together in series. Thus, combination of eight series transistors form a voltage divider to divide the voltage PAD 206 and generate a voltage around 3V on the node 634 for the safe signal 234.

Figure 6B:
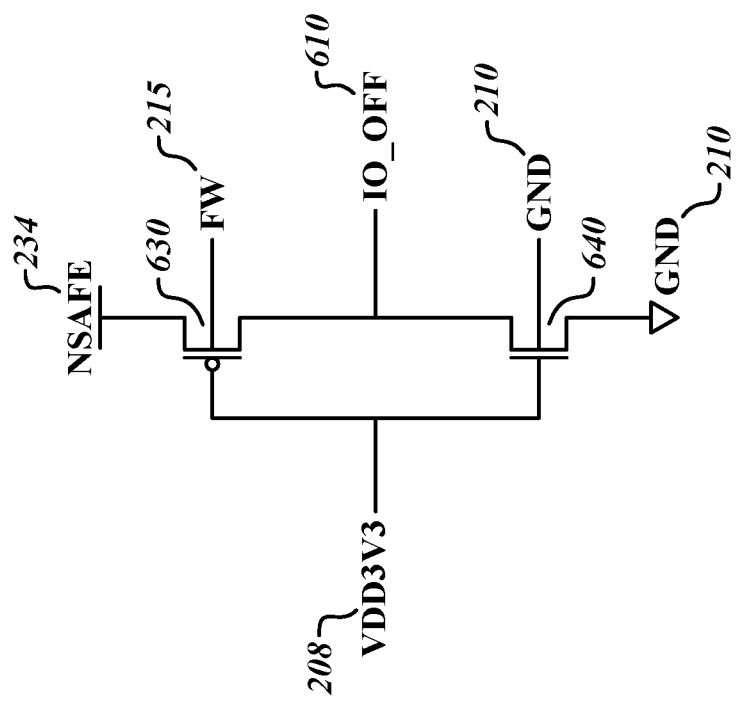
FIG. 6B is a circuit topology to generate an IO-off signal of FIG. 6A, in accordance with some embodiments.

FIG. 6B is a circuit to generate IO off signal 610. This circuit is a simple inverter including a PMOS 630 and a NMOS 640. The inverter generates the IO off signal 610 with a logical level reverse to the logical level of the voltage supply 208. Gate terminals of the transistors 630 and 640 are coupled to the voltage supply 208. If the voltage supply 208 is in high logical level, the NMOS 640 is ON and the IO off signal 610 is coupled to the ground 210 as a low logical level. If the voltage supply 208 is in a low logical level, then the PMOS 630 is ON and the safe signal 234 is dropped on the IO off signal 610. In this fashion, the safe signal 234 is in high logical level, then the IO off signal 610 is in high logical level. Thus, the IO off signal 610 which controls the PMOS 608 and NMOS 620 in FIG. 6A is reverse to the logical level of the voltage supply 208.

A device may be summarized as including a contact; and a transmit circuit coupled to the contact, the transmit circuit including: a first transistor having a terminal coupled to the contact; a second transistor having a terminal coupled to the contact; and a first safe signal generation circuit coupled to a gate of the first transistor of the transmit circuit, the first safe signal generation circuit including: a first transistor coupled to an enable signal and a second safe signal; a second transistor coupled to the first transistor and to the contact; a third transistor coupled to the second transistor at a node, the contact, and the second safe signal; a fourth transistor coupled to the third transistor at the node and the second safe signal; and a fifth transistor coupled to the fourth transistor and to a no fault enable signal, the first safe signal being on the node.

The first safe signal generation circuit may further include a sixth transistor coupled to the fifth transistor and the enable signal.

The device may further include a no fault enable signal generation circuit that includes: a first transistor coupled to the contact and second safe signal; a second transistor coupled to the first transistor and a fault enable signal; a third transistor coupled to the fault enable signal, the second safe signal, and a node; and a fourth transistor coupled to the fault enable signal and the node, the no fault enable signal being on the node.

The transmit circuit may further include a third transistor coupled to the second transistor and a first control signal generation circuit, the control signal generation circuit including: a first logical gate coupled to the enable signal and the no fault enable signal; and a second logical gate coupled to the first logical gate and a first control data, an output of the second logical gate being coupled to a gate of the third transistor of the transmit circuit.

The transmit circuit may further include a fourth transistor coupled to the first transistor, a second control signal generation circuit, and a voltage supply, the first and fourth transistors being in series and having a first channel type, the second and third transistors being in series and having a second channel type.

The first and second transistors of the first safe signal generation circuit may be in series and may have a first channel type, the fourth, fifth, and sixth transistors of the first safe signal generation circuit may be in series and may have a second channel type.

The first and second logical gates may be AND gates.

The first and third transistors of the transmit circuit may have a first channel type, and the second and fourth transistors of the transmit circuit may have a second channel type.

The first and third transistors of the transmit circuit may be coupled to a voltage node, the voltage node being a maximum voltage of the voltage supply and a voltage of the contact.

The first, second, and third transistors of the first safe signal generation circuit may be coupled to the voltage node.

The first and third transistors of the no fault enable signal generation circuit may be coupled to the voltage node.

A method of protecting a circuit may be summarized as including forming a contact; and coupling a transmit circuit to the contact, forming the transmit circuit including: coupling a first transistor to the contact; coupling a second transistor to the contact; and coupling a first safe signal generation circuit to a gate of the first transistor of the transmit circuit, coupling the first safe signal generation circuit including: coupling a first transistor to an enable signal and a second safe signal;

coupling a second transistor to the first transistor and to the contact; coupling a third transistor to the second transistor at a node, the contact, and the second safe signal; coupling a fourth transistor to the third transistor at the node and the second safe signal; and coupling a fifth transistor to the fourth transistor and to a no fault enable signal, the first safe signal being on the node.

Coupling the first safe signal generation circuit may further include coupling a sixth transistor to the fifth transistor and the enable signal.

The method may further form a no fault enable signal generation circuit that includes: coupling a first transistor to the contact and second safe signal; coupling a second transistor to the first transistor and a fault enable signal; coupling a third transistor to the fault enable signal, the second safe signal, and a node; and coupling a fourth transistor to the fault enable signal and the node, the no fault enable signal being on the node.

Coupling the transmit circuit may further include coupling a third transistor to the second transistor and a first control signal generation circuit, the control signal generation including: coupling a first logical gate to the enable signal and the no fault enable signal; and coupling a second logical gate to the first logical gate and a first control data, an output of the second logical gate being coupled to a gate of the third transistor of the transmit circuit.

A method of high-voltage fault protection may be summarized as including detecting a voltage of a node of a transmit circuit, the transmit circuit is transmitting first data through a first transistor and a second transistor, and is transmitting second data with a third transistor and a fourth transistor; generating a first safe signal by a first safe signal generation circuit, the first safe signal being the voltage of the node when the voltage of the node is higher than a threshold; coupling the third transistor to a voltage supply, the third transistor coupled between the fourth transistor and the node; and switching off the fourth transistor when the voltage of the node is higher than a threshold, the fourth transistor is coupled to a ground and the third transistor.

Generating the first safe signal may include coupling a first transistor to an enable signal and a second safe signal; coupling a second transistor to the first transistor and to the contact; coupling a third transistor to the second transistor at a node, the contact, and the second safe signal; coupling a fourth transistor to the third transistor at the node and the second safe signal; coupling a fifth transistor to the fourth transistor and to a no fault enable signal, the first safe signal being on the node; and coupling a sixth transistor to the fifth transistor and the enable signal.

The method may further form a no fault enable signal generation circuit that includes: coupling a first transistor to the contact and second safe signal; coupling a second transistor to the first transistor and a fault enable signal; coupling a third transistor to the fault enable signal, the second safe signal, and a node; and coupling a fourth transistor to the fault enable signal and the node, the no fault enable signal being on the node.

Switching off the fourth transistor may include coupling a first logical gate to the enable signal and the no fault enable signal; and coupling a second logical gate to the first logical gate and a first control data, an output of the second logical gate being coupled to a gate of the fourth transistor of the transmit circuit.

The first and second logical gates may be AND gates.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A device, comprising:
   a contact; and
   a transmit circuit coupled to the contact, the transmit circuit including:
   a first transistor having a terminal coupled to the contact;
   a second transistor having a terminal coupled to the contact; and
   a first safe signal generation circuit that, in operation, generates a first safe signal, the first safe signal generation circuit being coupled to a gate of the first transistor of the transmit circuit, the first safe signal generation circuit including:
   a first transistor coupled to an enable signal and a second safe signal;
   a second transistor coupled to the first transistor and to the contact;
   a third transistor coupled to the second transistor at a node, the contact, and the second safe signal;

a fourth transistor coupled to the third transistor at the node and the second safe signal; and a fifth transistor coupled to the fourth transistor and to a no fault enable signal, the first safe signal being on the node.

2. The device of claim 1 wherein the first safe signal generation circuit further including a sixth transistor coupled to the fifth transistor and the enable signal.

3. The device of claim 2, further comprising a no fault enable signal generation circuit that, in operation, generates a no fault enable signal, wherein the no fault enable signal generation circuit includes:

a first transistor coupled to the contact and second safe signal;

a second transistor coupled to the first transistor and a fault enable signal;

a third transistor coupled to the fault enable signal, the second safe signal, and a node; and a fourth transistor coupled to the fault enable signal and the node, the no fault enable signal being on the node.

4. The device of claim 3 wherein the transmit circuit further includes:

a third transistor coupled to the second transistor and a first control signal generation circuit, the first control signal generation circuit including:

a first logical gate coupled to the enable signal and the no fault enable signal; and a second logical gate coupled to the first logical gate and a first control data, an output of the second logical gate being coupled to a gate of the third transistor of the transmit circuit.

5. The device of claim 4 wherein the transmit circuit further includes:

a fourth transistor coupled to the first transistor, a second control signal generation circuit, and a voltage supply, the first and fourth transistors being in series and having a first channel type, the second and third transistors being in series and having a second channel type.

6. The device of claim 4 wherein the first and second transistors of the first safe signal generation circuit being in series and having a first channel type, the fourth, fifth, and sixth transistors of the first safe signal generation circuit being in series and having a second channel type.

7. The device of claim 4 wherein the first and second logical gates are AND gates.

8. The device of claim 4 wherein the first and third transistors of the transmit circuit have a first channel type, and the second and fourth transistors of the transmit circuit have a second channel type.

9. The device of claim 5 wherein the first and third transistors of the transmit circuit are coupled to a voltage node, the voltage node is a maximum voltage of the voltage supply and a voltage of the contact.

10. The device of claim 9 wherein the first, second, and third transistors of the first safe signal generation circuit are coupled to the voltage node.

11. The device of claim 10 wherein the first and third transistors of the no fault enable signal generation circuit are coupled to the voltage node.

12. A method of protecting a circuit, comprising:

forming a contact coupled to an output stage; and coupling a transmit circuit to the contact, the transmit circuit including a first and second PMOS coupled between a voltage supply and the contact, and a first and a second NMOS coupled between the contact and a reference node;

coupling a protection circuit to the transmit circuit for protecting the transmit circuit, the protecting includes:

detecting a voltage of the contact;

applying a first safe signal to the second PMOS, the first safe signal being in high-logical level when the voltage of the contact is greater than a threshold;

applying a second safe signal to the second NMOS, the second safe signal being in high-logical level when the voltage of the contact is greater than the threshold; and applying a control signal to the first NMOS, the control signal being in low-logical level when the voltage of the contact is greater than the threshold, wherein applying the first safe signal includes:

coupling a first transistor to an enable signal and the second safe signal;

coupling a second transistor to the first transistor and to the contact;

coupling a third transistor to the second transistor at a node, the third transistor being coupled to the contact and the second safe signal;

coupling a fourth transistor to the third transistor at the node, the fourth transistor being controlled by the second safe signal; and coupling a fifth transistor to the fourth transistor, the fifth transistor being controlled by a no fault enable signal, the first safe signal being on the node.

13. The method of claim 12, further coupling a sixth transistor to the fifth transistor, the sixth transistor being controlled by the enable signal.

14. The method of claim 13, further comprising:

forming a no fault enable signal generation circuit, wherein the forming the no fault enable signal generation circuit includes:

coupling a first transistor to the contact and second safe signal;

coupling a second transistor to the first transistor and a fault enable signal;

coupling a third transistor to the fault enable signal, the second safe signal, and a node;

and coupling a fourth transistor to the fault enable signal and the node, the no fault enable signal being on the node.

15. The method of claim 14 wherein applying the control signal includes:

coupling a first logical gate to the enable signal and the no fault enable signal; and coupling a second logical gate to the first logical gate and a first control data, an output of the second logical gate being the control signal.

16. A method of high-voltage fault protection, comprising:

detecting a voltage of a contact of a transmit circuit, the transmit circuit transmitting first data through a first transistor and a second transistor, and transmitting second data with a third transistor and a fourth transistor;

generating a first safe signal by a first safe signal generation circuit, the first safe signal being the voltage of the contact when the voltage of the contact is higher than a threshold;

coupling the third transistor to a voltage supply, the third transistor coupled between the fourth transistor and the contact; and switching off the fourth transistor when the voltage of the contact is higher than a threshold, the fourth transistor being coupled to a ground and the third transistor, wherein generating the first safe signal includes:
- coupling the first transistor to an enable signal and a second safe signal;
- coupling the second transistor to the first transistor and to the contact;
- coupling the third transistor to the second transistor at a node, the third transistor being coupled to the contact and the second safe signal;
- coupling the fourth transistor to the third transistor at the node and the second safe signal;
- coupling a fifth transistor to the fourth transistor and to a no fault enable signal, the first safe signal being on the node; and
- coupling a sixth transistor to the fifth transistor and the enable signal.

17. The method of claim 16, further forming a no fault enable signal generation circuit that includes:
- coupling a first transistor to the contact and second safe signal;
- coupling a second transistor to the first transistor and a fault enable signal;
- coupling a third transistor to the fault enable signal, the third transistor being coupled to the second safe signal and a node; and
- coupling a fourth transistor to the fault enable signal and the node, the no fault enable signal being on the node.

18. The method of claim 17 wherein switching off the fourth transistor of the transmit circuit includes:
- coupling a first AND gate to the enable signal and the no fault enable signal; and
- coupling a second AND gate to a first logical gate and a first control data, an output of a second logical gate being coupled to the fourth transistor of the transmit circuit.

\* \* \* \* \*